United States Patent [19]

Fujii

[11] Patent Number: 4,594,576
[45] Date of Patent: Jun. 10, 1986

[54] CIRCUIT ARRANGEMENT FOR A/D AND/OR D/A CONVERSION WITH NONLINEAR D/A CONVERSION

[75] Inventor: Katsuyoshi Fujii, Osaka, Japan

[73] Assignee: Matsushita Electric Industrial Company, Limited, Japan

[21] Appl. No.: 507,541

[22] Filed: Jun. 24, 1983

[51] Int. Cl.[4] .................... H03K 13/02; H03K 13/04
[52] U.S. Cl. .................... 340/347 AD; 340/347 DA
[58] Field of Search ............ 340/347 DA, 347 AD, 340/347 SH, 347 NT

[56] References Cited

U.S. PATENT DOCUMENTS

| | | | |
|---|---|---|---|
| 3,533,098 | 10/1970 | Munoz | 340/347 AD |
| 3,544,993 | 12/1970 | Gabriel | 340/347 AD |
| 3,573,795 | 4/1971 | Bowers, Jr. | 340/347 DA |
| 3,670,326 | 6/1972 | Sloan et al. | 340/347 DA |
| 3,760,407 | 9/1973 | Terry | 340/347 NT |
| 3,877,026 | 4/1975 | Wintz et al. | 340/347 DA |
| 3,997,892 | 12/1976 | Susset | 340/347 AD |
| 4,350,974 | 9/1982 | Gordon et al. | 340/347 DA |

Primary Examiner—David Smith, Jr.
Attorney, Agent, or Firm—Lowe, Price, LeBlanc, Becker & Shur

[57] ABSTRACT

In an analog-to-digital (A/D) converter or a digital-to-analog (D/A) converter, a nonlinear D/A converter is employed. The nonlinear D/A converter comprises an absolute value circuit, a D/A converter, and another D/A converter having a function of multiplication. The latter D/A converter is responsive to a digital signal and to an analog signal from the former D/A converter so as to produce an analog signal indicative of the square of the digital signal. In an A/D converter, the nonlinear D/A converter is put in a negative feedback loop following an output of a successive approximation register so as to produce a reference signal with which an input analog signal to be converted will be compared by a comparator. The invention enables A/D conversion of a wide dynamic range signal by using a small number of bits, while quantization noise with respect to a low level signal is maintained low.

10 Claims, 13 Drawing Figures

CIRCUIT ARRANGEMENT FOR A/D AND/OR D/A CONVERSION WITH NONLINEAR D/A CONVERSION

BACKGROUND OF THE INVENTION

This invention relates generally to signal processing circuits, such as analog-to-digital converters and digital-to-analog converters.

Generally speaking, the resolving power of a digital signal converted from an analog signal is determined by the number of bits used in conversion, and its expressive power V is determined by:

$$V = \frac{1}{2}^n$$

wherein the fullscale value is assumed to be 1.

Namely, the expressive power has no relation with the magnitude of the input analog signal, and therefore, a number of bits are necessary in order to convert an analog signal having a wide dynamic range. When it is intended to express an analog signal having a wide dynamic range by way of a small number of bits, the expressive power V has to be changed in accordance with the level of the input analog signal.

SUMMARY OF THE INVENTION

The present invention has been developed in view of the above.

It is, therefore, an object of the present invention to provide a new and useful A/D converter and/or a D/A converter which are capable of improving the expressive power without increasing the number of bits.

According to a feature of the present invention a reference voltage of a digital-to-analog converter which is used in an analog-to-digital converter is changed to better the expressive power. Namely, the present invention employs a nonlinear D/A converter which utlizes an instantaneous compression circuit in which a value obtained by multiplying a square root of absolute values of input analog or digital signal by the polarity, for providing an A/D converter or a D/A converter.

BRIEF DESCRIPTION OF THE DRAWINGS

The object and features of the present invention will become more readily apparent from the following detailed description of the preferred embodiments taken in conjunction with the accompanying drawings in which.

The same or corresponding elements and parts are designated at like reference numerals throughout the drawings.

DETAILED DESCRIPTION OF THE INVENTION

Figure 1:
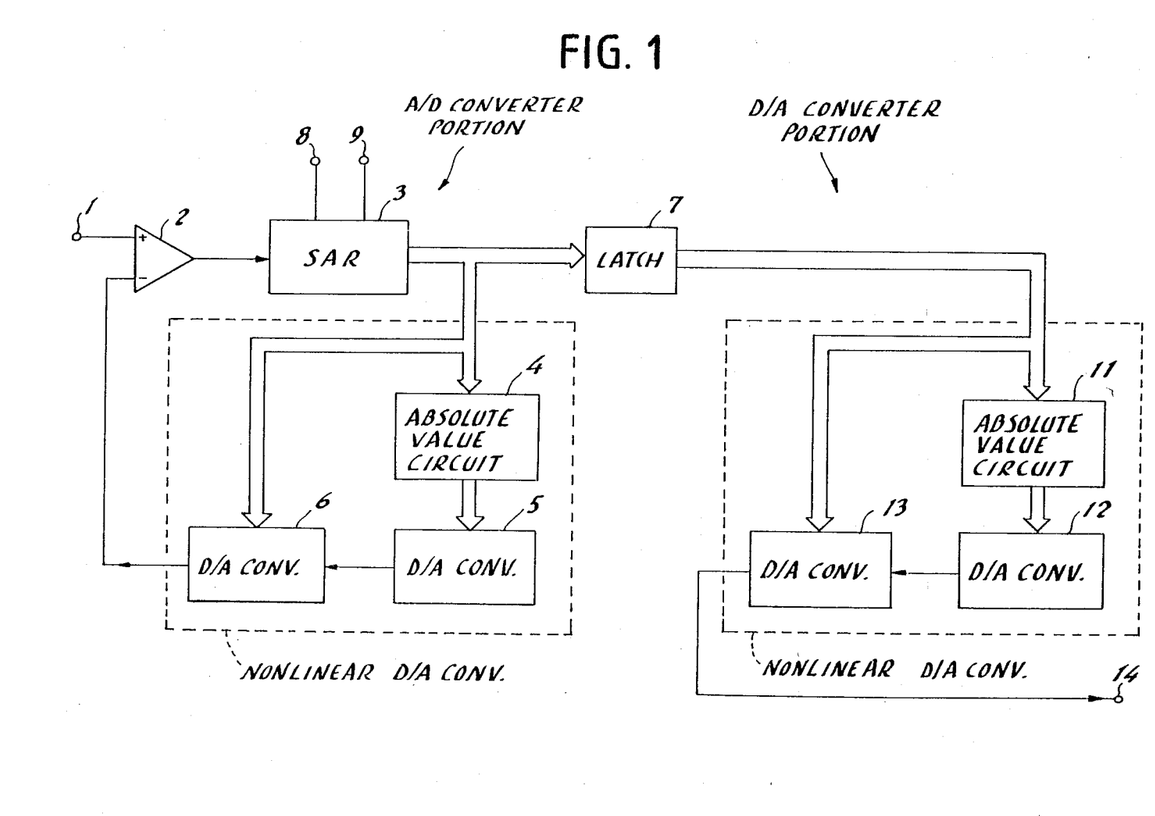
FIG. 1 is a schematic block diagram of an embodiment of the present invention, which embodiment includes an A/D converter portion and a D/A converter portion.

Referring now to FIG. 1, an embodiment of a signal processing circuit according to the present invention is shown. The reference 1 is an analog signal input terminal; 2, a voltage comparator; 3, a successive approximation register (SAR); 4, an absolute value circuit; 5, a D/A converter; 6, a D/A converter having multiplication function. A digital output signal from the successive approximation register 3 is fed to a latch. These blocks mentioned in the above constitute an A/D converter portion which converts an input analog signal into a digital signal. Namely, the left half of FIG. 1 is the A/D converter portion, and the right half of the same is a D/A converter portion arranged to reproduce the original input analog signal by using an A/D converted signal from the A/D converter portion. The A/D converter portion will be described first, and then the D/A converter portion will be described.

The absolute value circuit 4, and the two D/A converters 5 and 6 constitute a nonlinear D/A converter which outputs an analog signal corresponding to the square of the digital data from the successive approximation register 3. The successive approximation register 3 has a conversion table shown below.

| Time | INPUTS | | | OUTPUTS | | | | | | | | |
|---|---|---|---|---|---|---|---|---|---|---|---|---|
| In | D | $\bar{S}$ | $Q_D$ | $Q_7$ | $Q_6$ | $Q_5$ | $Q_4$ | $Q_3$ | $Q_2$ | $Q_1$ | $Q_0$ | $\overline{CC}$ |
| 0 | X | L | X | X | X | X | X | X | X | X | X | X |
| 1 | $D_7$ | H | X | L | H | H | H | H | H | H | H | H |
| 2 | $D_6$ | H | $D_7$ | $D_7$ | L | H | H | H | H | H | H | H |
| 3 | $D_6$ | H | $D_6$ | $D_7$ | $D_6$ | L | H | H | H | H | H | H |
| 4 | $D_4$ | H | $D_5$ | $D_7$ | $D_6$ | $D_5$ | L | H | H | H | H | H |
| 5 | $D_3$ | H | $D_4$ | $D_7$ | $D_6$ | $D_5$ | $D_4$ | L | H | H | H | H |
| 6 | $D_2$ | H | $D_3$ | $D_7$ | $D_6$ | $D_5$ | $D_4$ | $D_3$ | L | H | H | H |
| 7 | $D_1$ | H | $D_2$ | $D_7$ | $D_6$ | $D_5$ | $D_4$ | $D_3$ | $D_2$ | L | H | H |
| 8 | $D_0$ | H | $D_1$ | $D_7$ | $D_6$ | $D_5$ | $D_4$ | $D_3$ | $D_2$ | $D_1$ | L | H |
| 9 | X | H | $D_0$ | $D_7$ | $D_6$ | $D_5$ | $D_4$ | $D_3$ | $D_2$ | $D_1$ | $D_0$ | L |
| 10 | X | H | X | $D_7$ | $D_6$ | $D_5$ | $D_4$ | $D_3$ | $D_2$ | $D_1$ | $D_0$ | L |

In the above table, various references are used as follows:

$\bar{S}$: start pulse;
D: input data;
$Q_D$: serial data;
$Q_7$ to $Q_0$: parallel data;
$\overline{CC}$: end-of-conversion signal.

The above successive approximation register 3, which will be described in detail later with reference to FIG. 11, starts operating in response to the start signal S so as to output input data from a serial data output terminal $Q_D$ and parallel data output terminals $Q_7$ to $Q_0$ in synchronism with the clock pulse one after another. When all bits have been converted, the end-of-conversion signal $\overline{CC}$ is outputted from the successive approximation register 3.

The absolute value circuit 4, which will be described later in datail with reference to FIG. 12, effects conversion as shown in the following table.

| +FS | 0 | 0 | 0 | 0 | 0 | 0 | 0 | 0 |
|-----|---|---|---|---|---|---|---|---|
| 0   | 0 | 1 | 1 | 1 | 1 | 1 | 1 | 1 |
|     | 1 | 0 | 0 | 0 | 0 | 0 | 0 | 0 |
| −FS | 1 | 1 | 1 | 1 | 1 | 1 | 1 | 1 |
| +FS | 0 | 0 | 0 | 0 | 0 | 0 | 0 | 0 |
| 0   | 0 | 1 | 1 | 1 | 1 | 1 | 1 | 1 |
|     | 0 | 1 | 1 | 1 | 1 | 1 | 1 | 0 |
| −FS | 0 | 0 | 0 | 0 | 0 | 0 | 0 | 0 |

In the above the reference FS indicates the fullscale value.

When an analog signal is applied to the analog input terminal 1 of the A/D converter, the polarity of the analog signal is detected by the voltage comparator 2, and the result of the detection is fed to the successive approximation register 3 having a clock input terminal 8 and a conversion start pulse input terminal 9. The successive approximation register 3 determines the most-significant bit (MSB) by using a clock signal and a conversion start pulse signal fed from the input terminals 8 and 9. Then digital data, only the MSB of which has been determined, is fed to the nonlinear D/A converter comprising the absolute value circuit 4 and two D/A convertors 5 and 6. As a result, an analog signal indicative of a square value of the digital data is outputted from the D/A converter 6 to be applied to the voltage comparator 2 as a reference voltage. The input analog signal from the input terminal 1 is then compared with the reference voltage by the voltage comparator 2, and the result of comparison is taken into the successive approximation register 3 in synchronism with the clock signal fed to the clock input terminal 8. The above operation will be repeated until the least-signiificant bit (LSB) will be determined. Output data resulting from this operation equals a square root of the input analog signal from which polarity has been removed.

Figure 2:
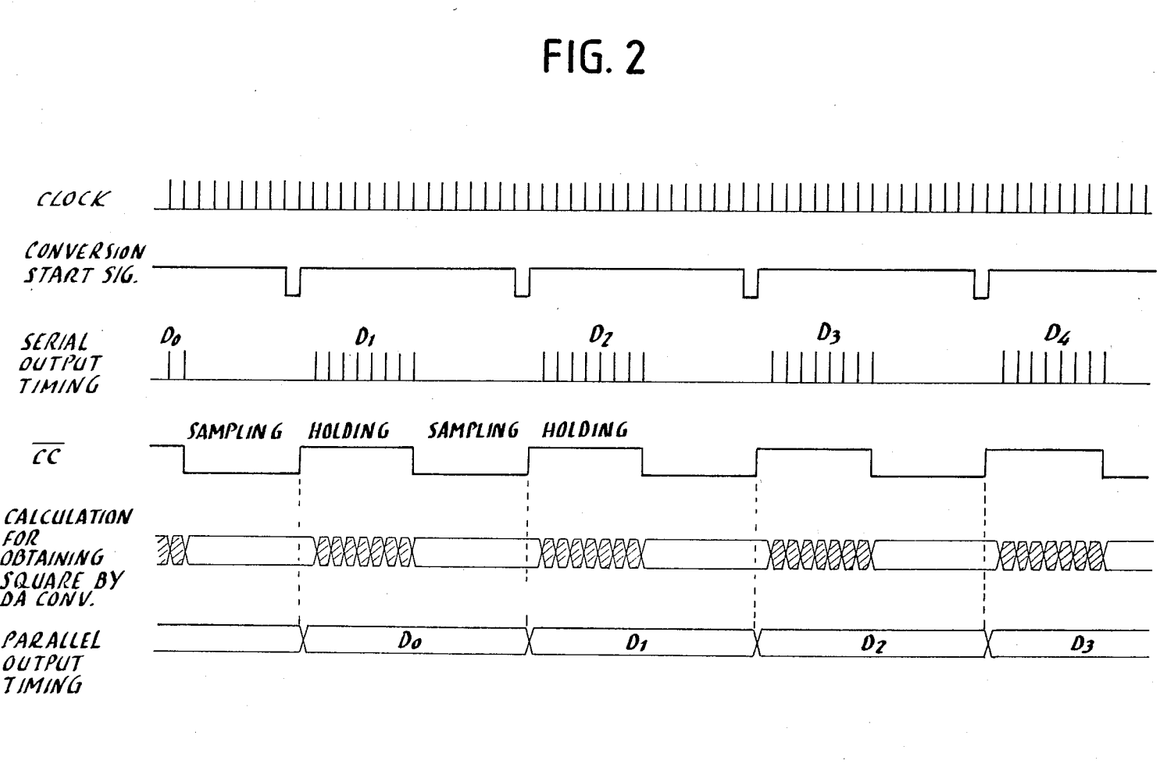
FIG. 2 is a time chart useful for understanding the operation of the A/D converter portion of FIG. 1.

The above operation will be further described in detail with reference to FIG. 2 showing a timing chart of the A/D converter portion, i.e. the left half in FIG. 1. The successive approximation register 3 starts determining each bit from the MSB in synchronism with the clock signal after the conversion start signal is applied. When the LSB has been determined, namely, all the bits have been determined, an end-of-conversion signal $\overline{CC}$ is outputted. The parallel output data from the successive approximation register 3 is fed to both the D/A converter 6 having a function of multiplication and to the absolute value circuit 4. As a result, the output signal from the D/A converter 6 represents the square value of the output data from the successive approximation register 3. The D/A converter is located so that a feedback loop is constituted for the combination of the voltage comparator 2 and successive approximation register 3. The feedback loop is constructed such that the difference between the analog input signal and the squared data is minimum, and therefore, the output data from the successive approximation register 3 is in proportion to the square root of the analog input signal. Since this operation is completed within a single sampling period, no time delay occurs.

Figure 3:
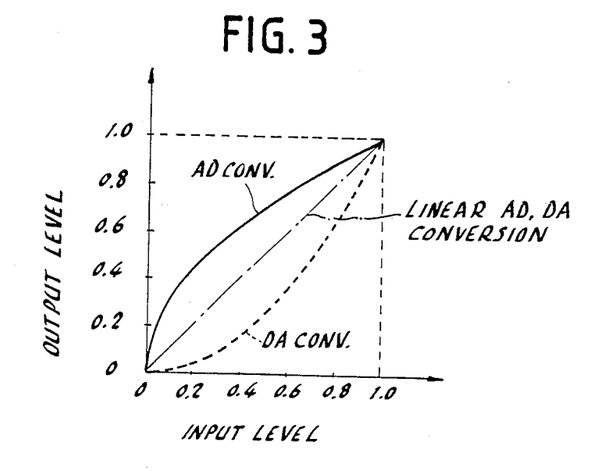
Fig. 3 is a graphical representation showing A/D and D/A converting characteristics according to the present invention.
Figure 4:
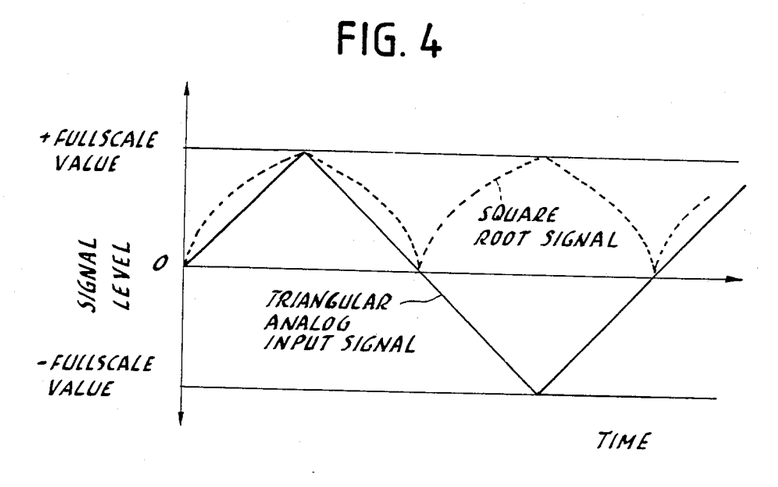
FIG. 4 is a waveform chart showing an input triangular analog signal, and its square root signal.
Figure 5:
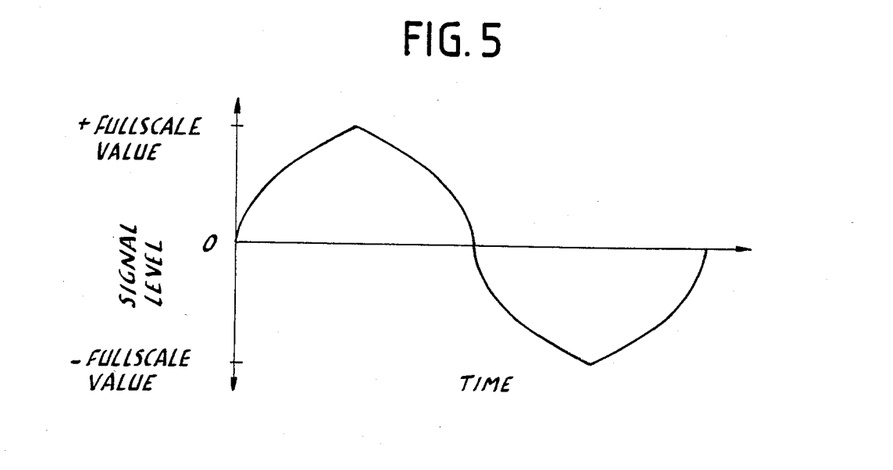
FIG. 5 is a waveform chart showing the output digital signal from the successive approximation register of FIG. 1 by way of an analog signal waveform.

The state of the signal on A/D conversion will be described with reference to FIGS. 3, 4 and 5. FIG. 3 shows the relationship between the level of the analog input signal fed to the A/D converter portion and the level of the converted digital signal (see a solid curve). As will be understood from FIG. 3, the output level equals a square root of the input analog signal level. The reason of this is that the D/A converter 6 which produces the square of the signal within a negative feedback loop is employed in the A/D converter portion forming the negative feedback loop. Since the A/D converter portion constitutes a negative feedback loop, the reference voltage applied to the inverting input terminal (−) of the voltage comparator 2 has a waveform similar to that of the input analog signal fed to the noninverting input terminal (+) of the same. A dotted curve in FIG. 3 shows the D/A converting characteristic of the D/A converter portion following the A/D converter portion. A dot-dash line between the above-mentioned two curves indicates a conventional linear A/D or D/A converting characteristic. As will be understood from the following description, when an analog signal fed to the analog input terminal 1 is first A/D converted by the A/D converting portion, and then D/A converted by the D/A converter portion of FIG. 1, the characteristic of the output analog signal from the output terminal 14 corresponds to this dot-dash line since the dotted curve and the solid curve are symmetrical.

Figure 8:
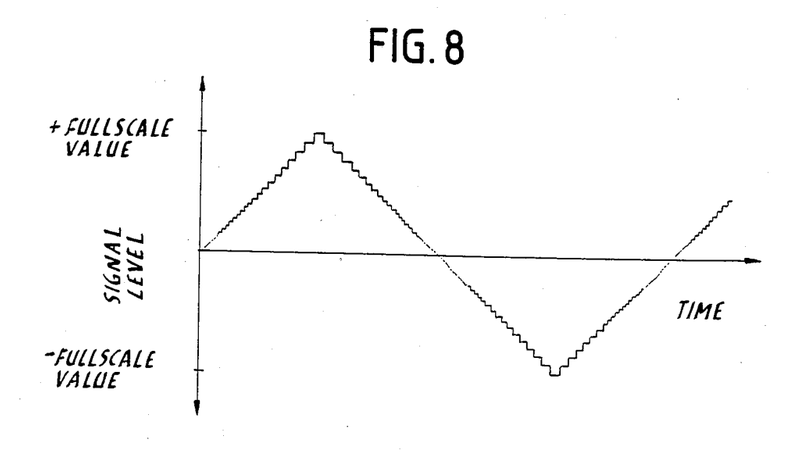
FIGS. 8 and 9 are waveform charts respectively showing analog signals which are A/D and then D/A converted by the circuitry of the invention and the prior art.

The D/A converter 6 having a function of multiplication has digital input terminals for receiving the output data from the successive approximation register 3, and an analog input terminal for receiving the analog output signal from the other D/A converter 5. Assuming that an analog input signal having the waveform shown in FIG. 4 is applied to the analog input terminal 1, the digital data fed to the digital input of the D/A converter 6 varies as shown in FIG. 5 when expressed by way of an analog signal waveform for simplicity, and the analog signal fed to the analog input of the D/A converter 6 has a waveform as shown in FIG. 4 (see a dotted curve). This analog signal fed to the D/A converter 6 from the other D/A converter 5 represents an absolute value of the waveform shown in FIG. 5. Namely, the analog signal fed to the D/A converter 6 equals a square root of the analog input signal fed to the input terminal 1. Since the D/A converter 6 effects multiplication so that its input value is multiplied by the other input value, an output signal shown in FIG. 8 is obtained therefrom. It is to be noted that the waveform of the signal of FIG. 8 is very similar to that of the input analog signal (see FIG. 4) fed to the input terminal 1.

Figure 6:
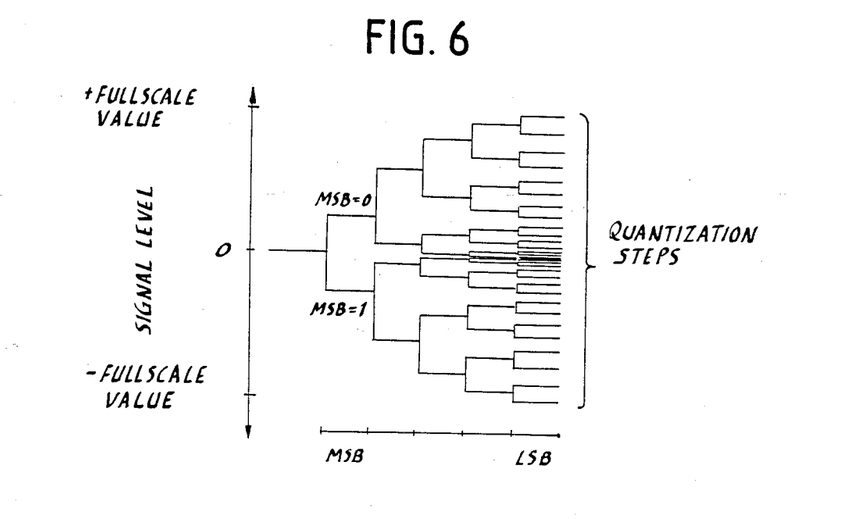
FIGS. 6 and 7 are explanatory diagrams respectively showing the operation in the present invention and in the prior art.
Figure 7:
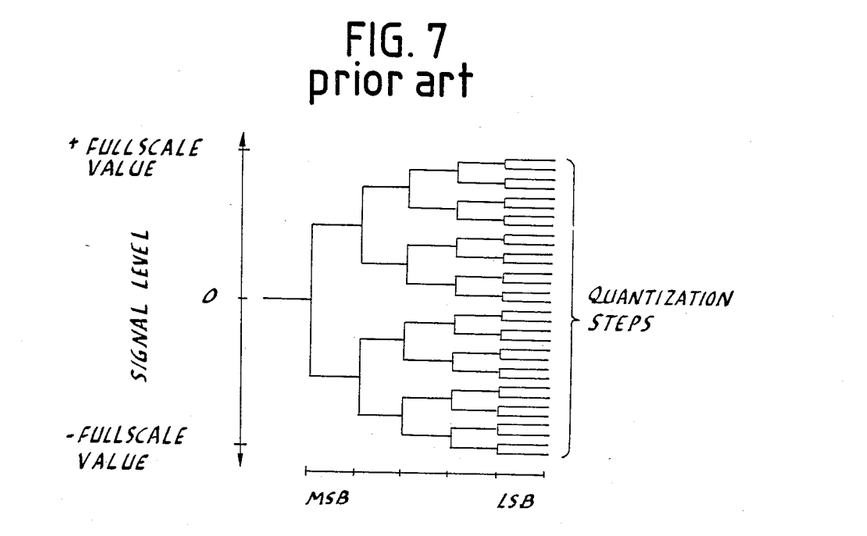

The feature of the present invention will be described taking an example of A/D conversion of a single sample of an input analog signal with reference to FIG. 6 showing an A/D converting state of one sample into 5-bit data. First of all, the MSB is determined as "0" or "1", and then each bit will be determined one after another to the LSB. From FIG. 6 it will be understood that the quantization step varies in accordance with the level of the input analog signal. FIG. 7 shows an A/D converting state by means of a conventional linear A/D converter. From the comparison between FIG. 6 and FIG.

7, it will be understood that the quantization step with respect to a low level input signal is small when the A/D converter portion according to the present invention is employed.

Turning back to FIG. 1, the D/A converter portion, i.e. the right half following the latch 7, comprises an absolute value circuit 11, and two D/A converters 12 and 13. The D/A converter portion is also of nonlinear type in the same manner as the A/D converter portion. Namely, the absolute value circuit 11, the two D/A converters 12 and 13 respectively correspond to circuits 4, 5 and 6 of the A/D converter portion, and therefore, detailed description thereof is omitted. The reference 14 is an output terminal of the D/A converter portion, from which output terminal a D/A converted analog signal will be derived.

Figure 9:
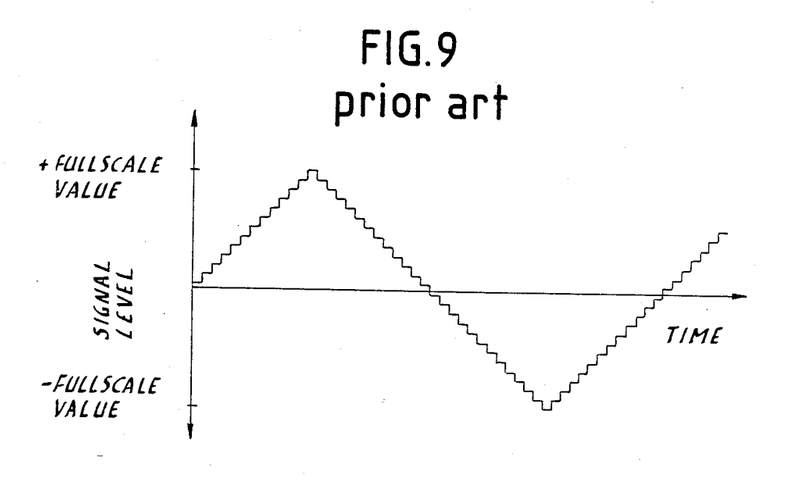

FIG. 8 shows a waveform of a triangular signal which is passed through the A/D converter portion and the D/A converter portion of FIG. 1. FIG. 9 shows a waveform of a triangular signal which is passed through a conventional A/D converter portion and a following conventional D/A converter portion which are both of linear type, where the number of bits used in A/D conversion is the same as that in A/D conversion of FIG. 8. From the comparison between the waveforms of FIG. 8 and FIG. 9, it will be understood that the quantization noise or distortion resulted from the nonlinear A/D converter portion and the nonlinear D/A converter portion D/A of FIG. 1, with respect to a low signal level, is smaller than that of the conventional linear A/D converter portion and D/A converter portion both processing the same bit number as that of the nonlinear A/D converter portion and the nonlinear D/A converter portion.

Figure 10:
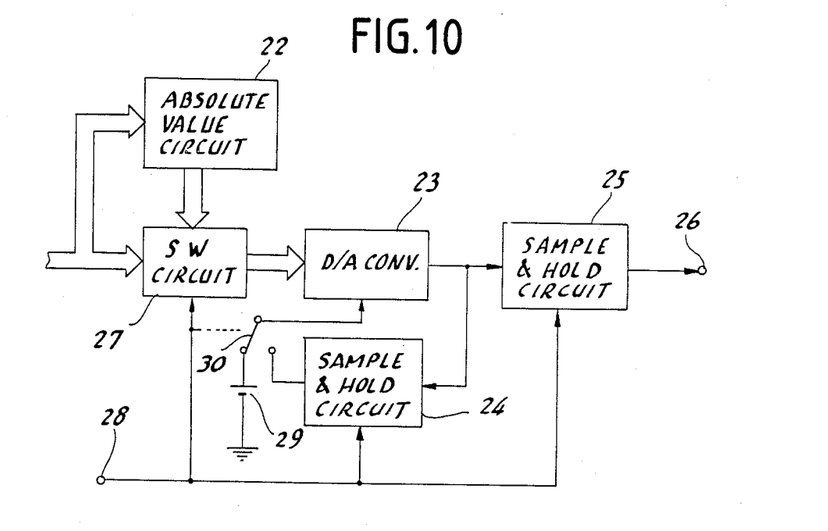
FIG. 10 is a schematic block diagram of another embodiment invention, which embodiment includes a D/A converter portion.

Reference is now made to FIG. 10 which shows another embodiment of the D/A converter portion according to the present invention. Namely, the circuit arrangement of FIG. 10 may be used in place of the right half of the circuitry of FIG. 1. The reference 22 is an absolute value circuit; 23, a D/A converter having a function of multiplication; 24 and 25, sample-and-hold circuits; 26, an analog signal output terminal; 27, a switching circuit; and 28, a timing control signal input terminal.

Digital data fed via the latch 7 from the A/D converter portion, i.e. the left half of FIG. 1, is applied directly and also through the absolute value circuit 22 to the switching circuit 27. The switching circuit 27 selects one of its two input data in accordance with a timing control signal fed thereto from the timing control signal input terminal 28. Assuming that absolute value data from the absolute value circuit 22 is selected, the output data from the switching circuit 27 is then fed to the D/A converter 23 having a function of multiplication. At this time a switch 30, which is controlled by the timing control signal, is in a position selecting a reference voltage from a voltage source 30. Therefore, the absolute value data is multiplied by the reference voltage in the D/A converter 23. The output signal from the D/A converter, which represents the result of the above-mentioned multiplication, is held by the sample-and-hold circuit 24 whose sampling period is controlled by the timing control signal from the timing control signal input terminal 28. In response to a subsequent pulse of the timing control signal, the switching circuit 27 and the switch 30 are both caused to select the digital data from the A/D converter portion and the above-mentioned analog signal held in the sample-and-hold circuit 24. As a result, the D/A converter 23 produces an analog signal corresponding to the square of the digital data from the A/D converter portion, and this analog signal is held in the sample-and-hold circuit 25 whose sampling period is controlled by the timing control signal from the timing control signal input terminal 28. In this way, an analog output signal can be derived from the output terminal 26 connected to the output of the sample-and-hold circuit 25.

Although it has been described that the circuit arrangement of FIG. 10 may be used in place of the right half of FIG. 1, it may also be used in place of the circuitry 4, 5 and 6 which constitute the above-mentioned nonlinear D/A converter.

The A/D converter portion and D/A converter portion described in the above are both arranged to produce an output signal or data which equals the square or square root of its input signal or data. However, when one or more D/A converters having a function of multiplication is/are added to be connected in series, it is possible to produce output signal or data indicative of nth power or nth root of its input signal or data.

Now the above-described various blocks used in first and second embodiments will be further described in detail with reference to FIGS. 11, 12 and 13, taking an example of A/D conversion and D/A conversion of 8 bits.

Figure 11:
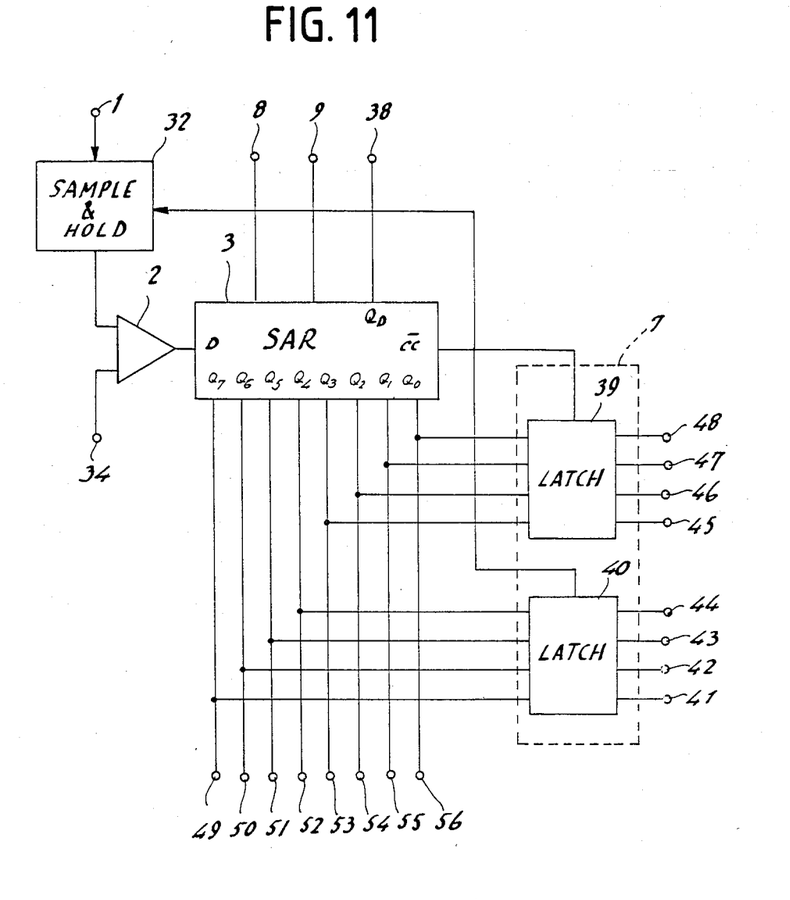
FIG. 11 is a circuit diagram of a part of the circuitry of FIG. 1.

FIG. 11 shows a circuit arrangement corresponding to a part of the left half of FIG. 1, which includes the voltage comparator 2 and the successive approximation register 3. In addition, a sample-and-hold circuit 32, and a pair of latches 39 and 40 corresponding to the latch 7 of FIG. 1 are shown. As the successive approximation register 3 may be used an IC chip AM2502 manufactured by AMD Corporation.

The sample-and-hold circuit 32, which is omitted from FIG. 1 for simplicity, samples and holds the input analog signal fed from the input terminal 1, and sends the held analog signal to the voltage comparator 2. The voltage comparator 2 has another input terminal for receiving via a terminal 34 the reference voltage from the nonlinear D/A converter of FIG. 1, and therefore the result of comparison between the input analog signal and the reference voltage is applied to the successive approximation register 3. The successive approximation register 3 has, in addition to a data input terminal D for receiving the data from the voltage comparator 3, a conversion start signal input terminal 9, a clock input terminal 8, a serial data output terminal 38 ($Q_D$), parallel data output terminals 49 through 56 ($Q_7$–$Q_0$), and an end-of-conversion signal output terminal CC. The end-of-conversion signal from the terminal CC is fed to the sample-and-hold circuit 32 as a timing signal for sample and hold operation, and also to the latches 39 and 40 as a timing signal for latching the parallel output data from the successive approximation register 3. The operational timing of these circuits are shown in the time chart of FIG. 2.

With the arrangement of FIG. 11 an A/D converted digital signal is outputted from the output terminals 41 through 48 of the latches 39 and 40, while eight bits are set one after another from the MSB at the output terminals 49 through 56 of the successive approximation register 3 after the receipt of the conversion start signal. When eight bits including the LSB have been set and outputted, the end-of-conversion signal $\overline{CC}$ is outputted.

Figure 12:
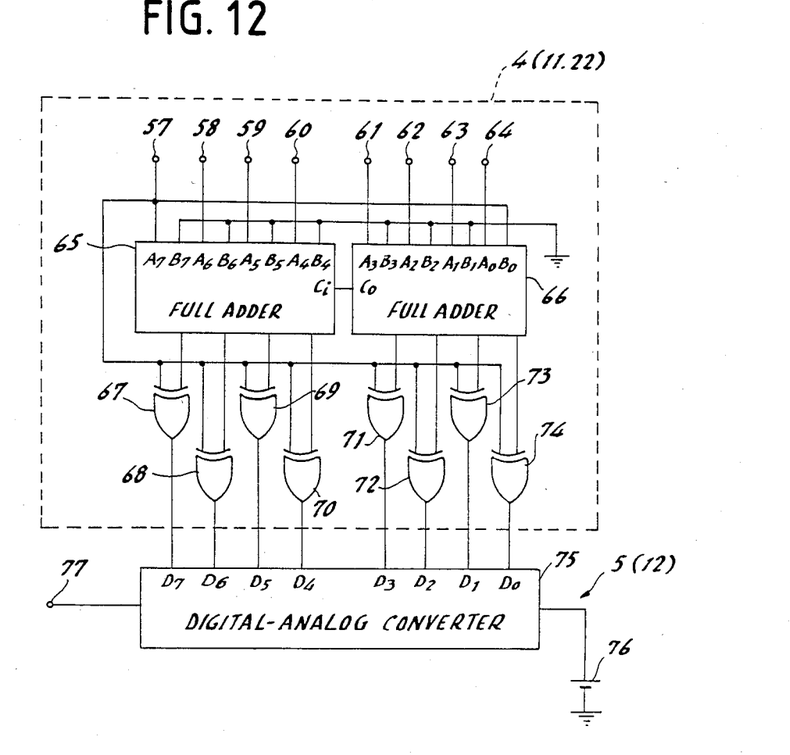
FIG. 12 is a circuit diagram of the combination of the absolute value circuit and the D/A converter used in embodiments of FIG. 1 and/or FIG. 10.

FIG. 12 shows the structure of the above-mentioned absolute value circuit 4, 11, or 22, and the D/A converter 5 or 12. The cicuitry of FIG. 12 has a function of an analog signal indicative of the absolute value of a digital signal which is expressed by complementary offset binary code. The absolute value circuit comprises a pair of 4-bit full adders 65 and 66 of this example, EX-OR gates 67 through 74. As the full adders 65 and 66 may be used IC chips known as LS283, such as SN74LS283 manufactured by Texas Instrument. As the D/A converter 5 or 12 may be used an IC chip known as DAC-08BC. An eight-bit digital signal is applied to input terminals 57 through 64, and the full adders 65 and 66, and the EX-OR gates 67 through 74 convert the digital signal into a digital signal indicative of the absolute value of the input digital signal. In the illustrated example, the MSB of the input digital signal is fed to the inut terminal 57, and lower bits are also fed to input terminals 58 through 64 so that the LSB is fed to the input terminal 64. With the circuit arrangement of FIG. 12, digital data indicative of an absolute value is obtained at the output terminals of the EX-OR gates 67 through 74, where the digital data has a positive polarity in complementary offset binary code. The absolute value data is fed to the D/A converter 5, 12 to which a reference voltage source 76 is connected, and therefore, an analog signal converted from the absolute value digital data is obtained at an output terminal 77.

Figure 13:
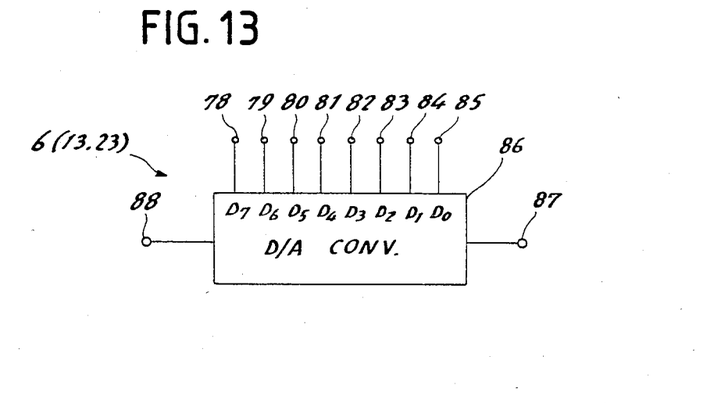
FIG. 13 is a pin connection diagram of the D/A converter having a function of multiplication, which D/A converter is used in embodiments of FIG. 1 and/or FIG. 10.

FIG. 13 shows a detailed pin connection of a D/A converter IC chip 86 which may be used for the D/A converter 6, 13 or 23. As the D/A converter 86 may be used an IC chip known as DAC-08BC. The references 78 through 85 are digital data input terminals; 87, a reference voltage input terminal; and 88, an analog signal output terminal. The D/A converter 86 effects multiplication between the digital input data and the reference voltage, and the result of multiplication is outputted as an analog signal from the output terminal 88.

Although the comparator 2 of FIGS. 1 and 11 has been described as a voltage comparator, a current comparator may also be used.

From the foregoing, it will be understood that one sample of the amplitude of an input analog signal is treated as a square root value thereof with the fullscale value being set to ±1 according to the present invention. Consequently, the resolving power is improved, and therefore, when converting an analog signal into a digital signal of an arbitrary number of bits, it is possible to express a wide dynamic range signal or a signal whose amplitude is very close to zero level.

The above-described embodiments are just examples of the present invention, and therefore, it will be apparent for those skilled in the art that many modifications and variations may be made without departing from the spirit of the present invention.

What is claimed is:

1. A circuit arrangement for converting an input analog signal into an output digital signal, comprising:
   (a) a comparator having first and second input terminals for respectively receiving said input analog signal and a reference signal;
   (b) a successive approximation register responsive to an output signal from said comparator for prodcuing said output digital signal; and
   (c) a nonlinear digital-to-analog converter means responsive to said output digital signal from said successive approximation register for producing said reference signal,
   said nonlinear digital-to-analog converting means including:
   (i) an absolute value circuit responsive to said output digital signal for producing an absolute value digital signal;
   (ii) a digital-to-analog converter responsive to said absolute value digital signal for converting the same into an analog signal; and
   (iii) a further digital-to-analog converter having function of multiplication and responsive to said analog signal from said first-mentioned digital-to-analog converter and to said output digital signal for producing an analog signal indicative of the result of multiplication between said analog signal from said first-mentioned digital-to-analog converter and said output digital signal, where said result multiplication corresponds to the square of said output digital signal from which polarity has been removed.

2. A circuit arrangement for converting an input analog signal into an output digital signal, comprising:
   (a) a comparator having first and second input terminals for respectively receiving said input analog signal and a reference signal;
   (b) a successive approximation register responsive to an output signal from said comparator for producing said output digital signal; and
   (c) a nonlinear digital-to-analog converting means responsive to said output digital signal from said successive approximation register for producing said reference signal,
   said nonlinear digital-to-analog converting means including:
   (i) an absolute value circuit responsive to said output digital signal for producing an absolute value digital signal;
   (ii) a switch circuit for selecting said output digital signal or said absolute value digital signal from said absolute value circuit in accordance with a timing control signal;
   (iii) a digital-to-analog converter having a function of multiplication and responsive to an analog signal and to said digital signal from said switching circuit for producing said reference signal indicative of the result of multiplication between said analog signal and said digital signal, where said result of multiplication corresponds to the square of said output digital signal from which polarity has been removed;
   (iv) a sample-and-hold circuit for sampling and holding said output analog signal from said digital-to-analog converter in response to said timing control signal; and
   (v) a further switching circuit for selecting one of a fixed reference voltage and an output signal from said sample-and-hold circuit in accordance with said timing control signal for providing said digital-to analog converter with said analog signal.

3. A circuit arrangement as claimed in claim 2, further comprising another sample-and-hold circuit controlled by said timing control signal for sampling and holding said reference signal from said multiplying digital-to-analog converter means.

4. A circuit arrangement as claimed in claim 3, wherein said comparator is one of a voltage comparator or a current comparator.

5. A circuit arrangement for converting an input digital signal into an output analog signal, comprising:
   (a) an absolute value circuit responsive to said input digital signal for producing an absolute value digital signal;
   (b) a digital-to-analog converter responsive to said absolute value digital signal for converting the same into an analog signal; and
   (c) a digital-to-analog converter having a function of multiplication and responsive to said analog signal from said first-mentioned digital-to-analog converter and to said input digital signal for producing said output analog signal indicative of the result of multiplication between said analog signal from said first-mentioned digital-to-analog converter and said output digital signal, where said result of multiplication corresponds to the square of said output digital signal from which polarity has been removed.

6. A circuit arrangement for converting an input digital signal into an output analog signal, comprising:
   (a) an absolute value circuit responsive to said input digital signal for producing an absolute value digital signal;
   (b) a further switching circuit for selecting said input digital signal or said absolute value digital signal from said absolute value circuit in accordance with a timing control signal;
   (c) a digital-to-analog converter having a function of multiplication and responsive to an analog signal and to said digital signal from said switching circuit for producing said output analog signal indicative of the result of multilplication between said analog signal and said digital signal, where said result of multiplication corresponds to the square of said output digital signal from which polarity has been removed;
   (d) a sample-and-hold circuit for sampling and holding said output analog signal from said digital-to-analog converter in response to said timing control signal; and
   (e) a switching circuit for selecting one of a fixed reference voltage and an output signal from said sample-and-hold circuit in accordance with said timing control signal for providing said digital-to-analog converter with said analog signal.

7. A circuit arrangement as claimed in claim 6, further comprising another sample-and-hold circuit controlled by said timing control signal for sampling and holding said output analog signal from said digital-to-analog converter.

8. A circuit arrangement for converting an input analog signal into an output digital signal, comprising:
   (a) a comparator having first and second input terminals for respectively receiving said input analog signal and a reference signal;
   (b) a successive approximation register responsive to an output signal from said comparator for producing said output digital signal; and
   (c) a curvilinear digital-to-analog converting means responsive to said output digital signal from said successive approximation register for producing said reference signal, aaid curvilinear digital-to-analog converting means having:
      (i) an absolute value circuit responsive to said output digital signal for producing an absolute value digital signal;
      (ii) a digital-to-analog converter responsive to said absolute value digital signal for converting the same into an analog signal;
      (iii) a multiplying digital-to-analog converter means operable for multiplying a digital input thereto by an analog input thereto and for producing an analog signal corresponding to the square of said output digital signal from which polarity has been removed, said multiplying digital-to-analog converter means responsive to said analog signal from said digital-to-analog converter and to said output digital signal thereby producing an analog signal indicative of the result of multiplication of said analog signal from said digital-to-analog converter, representing an absolute value of said output digital signal, by said output digital signal, whereby the output of said multiplying converter means corresponds to the square of said output digital signal.

9. A circuit arrangement for converting an input analog signal into an output digital signal, comprising:
   (a) a comparator having first and second input terminals for respectively receiving said input analog signal and a reference signal;
   (b) a successive approximation register responsive to an output signal from said comparator for producing said output digital signal; and
   (c) a curvilinear digital-to-analog converting means responsive to said output digital signal from said successive approximation register for producing said reference signal,
   said curvilinear digital-to-analog converting means having:
      (i) an absolute value circuit responsive to said output digital signal for producing an absolute value digital signal;
      (ii) a first switching circuit means for selecting said output digital signal or said absolute value digital signal from said absolute value circuit in accordance with a timing control signal;
      (iii) a multiplying digital-to-analog converter means operable for multiplying a digital input thereto by an analog input thereto and for producing an analog signal corresponding to the square of said output digital signal from which polarity has been removed, said multiplying digital-to-analog converter means responsive to an analog signal and to said digital signal from said first switching circuit means thereby to produce said reference signal indicative of the result of multiplication of said analog signal by said digital signal, whereby said reference signal corresponds to the square of said output digital signal from which polarity has been removed;
      (iv) a sample-and-hold circuit for sampling and holding said output analog signal from saod multiplying digital-to-analog converter means in response to said timing control signal; and
      (v) a further switching circut means for selecting one of a fixed reference voltage and an output signal from said sample-to-hold circuit in accordance with said timing control signal for providing said multiplying digital-to-analog converter means with said analog signal.

10. A circuit arrangement as claimed in claim 9, wherein said comparator is one of a voltage comparator or a current comparator.

* * * * *